US010660193B2

(12) United States Patent
Moiseev et al.

(10) Patent No.: US 10,660,193 B2
(45) Date of Patent: May 19, 2020

(54) MULTILAYER SUBSTRATE

(71) Applicant: KABUSHIKI KAISHA TOYOTA JIDOSHOKKI, Aichi-ken (JP)

(72) Inventors: Sergey Moiseev, Aichi-ken (JP); Masahiko Kawabe, Aichi-ken (JP); Yoshitaka Iwata, Aichi-ken (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 0 days.

(21) Appl. No.: 16/322,397

(22) PCT Filed: Jun. 5, 2017

(86) PCT No.: PCT/JP2017/020794
§ 371 (c)(1),
(2) Date: Jan. 31, 2019

(87) PCT Pub. No.: WO2018/025490
PCT Pub. Date: Feb. 8, 2018

(65) Prior Publication Data
US 2019/0182946 A1    Jun. 13, 2019

(30) Foreign Application Priority Data

Aug. 3, 2016  (JP) ................................. 2016-153085

(51) Int. Cl.
*H05K 1/03* (2006.01)
*H05K 1/16* (2006.01)
(Continued)

(52) U.S. Cl.
CPC ............. *H05K 1/0204* (2013.01); *H01F 5/00* (2013.01); *H01F 27/28* (2013.01); *H02M 7/003* (2013.01);
(Continued)

(58) Field of Classification Search
CPC .. H05K 1/03; H05K 1/16; H05K 1/18; H05K 3/10; H05K 3/30; H01F 27/24;
(Continued)

(56) References Cited

U.S. PATENT DOCUMENTS 6,317,948 B1 * 11/2001 Kola ...................... H05K 1/162
                                                              205/125
2002/0003715 A1    1/2002 Matsumoto et al.
(Continued)

FOREIGN PATENT DOCUMENTS

JP    H6-204052    7/1994
JP    H09-289128    11/1997
(Continued)

OTHER PUBLICATIONS

International Search Report in International Patent Application No. PCT/JP2017/020794, dated Aug. 22, 2017.

*Primary Examiner* — Xiaoliang Chen
(74) *Attorney, Agent, or Firm* — Greenblum & Bernstein, P.L.C.

(57) ABSTRACT

A multilayer substrate includes a first metal plate forming a first coil; a second metal plate facing the first metal plate in a coil-winding axis direction and forming a second coil; a first insulating layer having therein the first metal plate; and a second insulating layer having therein the second metal plate. A metal foil is connected to the first metal plate through a plurality of via holes. An electronic component embedded in the first insulating layer is connected to a pattern formed on the metal foil.

4 Claims, 8 Drawing Sheets

(51) Int. Cl.
  *H05K 1/18* (2006.01)
  *H05K 3/10* (2006.01)
  *H05K 3/30* (2006.01)
  *H01F 27/24* (2006.01)
  *H01F 27/28* (2006.01)
  *H01F 27/29* (2006.01)
  *H01F 27/32* (2006.01)
  *H01F 27/40* (2006.01)
  *H01L 23/00* (2006.01)
  *H05K 1/02* (2006.01)
  *H01F 5/00* (2006.01)
  *H05K 3/46* (2006.01)
  *H02M 7/00* (2006.01)
  *H05K 1/11* (2006.01)
  *H02M 3/335* (2006.01)

(52) U.S. Cl.
  CPC .............. *H05K 1/115* (2013.01); *H05K 1/16* (2013.01); *H05K 1/165* (2013.01); *H05K 1/185* (2013.01); *H05K 3/46* (2013.01); *H02M 3/335* (2013.01); *H05K 3/4644* (2013.01)

(58) Field of Classification Search
  CPC .......... H01F 27/28; H01F 27/29; H01F 27/32; H01F 27/40; H01L 23/00
  USPC ........ 361/709, 270, 761, 765, 782; 336/192, 336/199, 200, 227
  See application file for complete search history.

(56) References Cited

U.S. PATENT DOCUMENTS

| | | | |
|---|---|---|---|
| 2007/0003781 A1* | 1/2007 | de Rochemont | B82Y 30/00 428/615 |
| 2007/0030659 A1 | 2/2007 | Suzuki et al. | |
| 2007/0296534 A1* | 12/2007 | Carastro | H01F 17/0013 336/200 |
| 2009/0244866 A1* | 10/2009 | Kawano | H01F 38/14 361/765 |
| 2009/0295528 A1* | 12/2009 | Silva | H01F 3/10 336/200 |
| 2011/0133561 A1* | 6/2011 | Kanazawa | H01F 27/2804 307/75 |
| 2012/0098729 A1* | 4/2012 | Kato | G08B 13/00 343/856 |
| 2013/0200977 A1* | 8/2013 | Miyazaki | H01L 24/24 336/192 |
| 2013/0236337 A1* | 9/2013 | Gummin | F04B 43/043 417/412 |
| 2014/0049353 A1* | 2/2014 | Yoon | H01F 27/28 336/227 |
| 2014/0204553 A1 | 7/2014 | Wölfel | |
| 2014/0252533 A1* | 9/2014 | O'Sullivan | H01L 21/762 257/506 |
| 2014/0268615 A1* | 9/2014 | Yun | H05K 7/1092 361/782 |
| 2015/0070238 A1* | 3/2015 | de Rochemont | B82Y 30/00 343/843 |
| 2015/0302974 A1* | 10/2015 | Zhao | H01F 17/0013 361/270 |
| 2016/0094082 A1* | 3/2016 | Ookawa | H01F 38/14 320/108 |
| 2016/0111196 A1* | 4/2016 | Francis | H01F 27/2895 336/200 |
| 2016/0111197 A1* | 4/2016 | Kneller | H01F 27/2804 336/84 C |
| 2016/0150649 A1* | 5/2016 | Peng | H01L 23/49822 361/761 |
| 2016/0231364 A1* | 8/2016 | Nejatali | G01R 19/0092 |
| 2016/0233292 A1* | 8/2016 | Chen | H01L 28/10 |
| 2016/0254089 A1* | 9/2016 | Parish | H01F 27/266 336/199 |
| 2017/0141756 A1* | 5/2017 | Yun | H05K 3/4602 |

FOREIGN PATENT DOCUMENTS

| | | |
|---|---|---|
| JP | 2002-015927 | 1/2002 |
| JP | 2014-516208 | 7/2014 |
| JP | 2015-088689 | 5/2015 |
| WO | WO2005/032226 | 4/2005 |

* cited by examiner

MULTILAYER SUBSTRATE

CROSS-REFERENCE TO RELATED APPLICATIONS

This application is a National Stage of International Application No. PCT/JP2017/020794 filed Jun. 5, 2017, claiming priority based on Japanese Patent Application No. 2016-153085 filed Aug. 3, 2016, the contents of all of which are incorporated herein by reference in their entirety.

TECHNICAL FIELD

The present invention relates to a multilayer substrate.

BACKGROUND ART

A multilayer printed circuit board disclosed in Patent Document 1 includes four or more even number of layers having at least one outer layer which has a thin conductor with a small thickness formed thereon and is exposed to the outside; and at least one inner layer which has a thick conductor with a large thickness formed thereon and is not exposed to the outside, in which coil patterns are formed of the thick conductors formed on the inner layer, and electronic components are surface-mounted on the thin conductor formed on the outer layer.

CITATION LIST

Patent Document

Patent Document 1: Japanese Patent Application Publication No. 2015-88689

SUMMARY OF THE INVENTION

In the case where an insulating layer having therein a first coil and an insulating layer having therein a second coil are layered, disposing the coils and the electronic components in layers leads to an increase of the size in the layering direction. Further, there is a need to reduce the projected area.

An object of the present invention is to provide a multilayer substrate that can reduce the projected area and can suppress upsizing in the layering direction.

Solution to Problems

Technical Problem

According to a first aspect of the invention, a multilayer substrate includes a first metal plate forming a first coil; a second metal plate facing the first metal plate in a coil-winding axis direction and forming a second coil; a first insulating layer having therein the first metal plate; and a second insulating layer having therein the second metal plate. A metal foil forming a conductive layer is disposed on at least one of one surface of the first insulating layer and the other surface of the first insulating layer, and one surface of the second insulating layer and the other surface of the second insulating layer. The conductive layer is connected to the first metal plate through a via hole. An electronic component embedded in the first insulating layer is connected to a pattern of the metal foil forming the conductive layer.

In accordance with the first aspect of the invention, since the metal foil is patterned to be connected to the electronic component, the pattern can be made finer as compared with a case where the first metal plate is patterned to be connected, so that a projected area of the multilayer substrate can be reduced. Further, since the electronic component and the first metal plate are embedded in the first insulating layer, upsizing of the multilayer substrate in the layering direction can be suppressed as compared with a case where the electronic component and the first metal plate are embedded in different insulating layers and then layered.

In accordance with a second aspect of the invention, in the multilayer substrate according to the first aspect, the first insulating layer is disposed closer to a heat release member than the second insulating layer is, and the metal foil is disposed closer to the heat release member than the first metal plate and the second metal plate are.

In accordance with the second aspect of the invention, although the heat release performance of the metal foil to which the electronic component is connected is inferior to the heat release performance of the first metal plate, the heat release performance of the metal foil is increased by disposing the metal foil closer to the heat release member, which can suppress the degradation of the heat release performance.

In accordance with a third aspect of the invention, in the multilayer substrate according to the second aspect, the second insulating layer has therein a passive component.

In accordance with the third aspect of the invention, the passive component, which needs less heat release performance, may be embedded in the second insulating layer.

In accordance with a fourth aspect of the invention, in a multilayer substrate according to the second or third aspect, the electronic component embedded in the first insulating layer is a power element.

In accordance with the fourth aspect of the invention, the power element, which needs high heat release performance, may have great heat performance.

Advantageous Effects of Invention

According to the present invention, the multilayer substrate can reduce the projected area and can suppress upsizing in the layering direction.

DESCRIPTION OF EMBODIMENTS

Hereinafter, one embodiment embodied in an insulating DC-DC converter will be hereinafter described with reference to the drawings.

Figure 1:
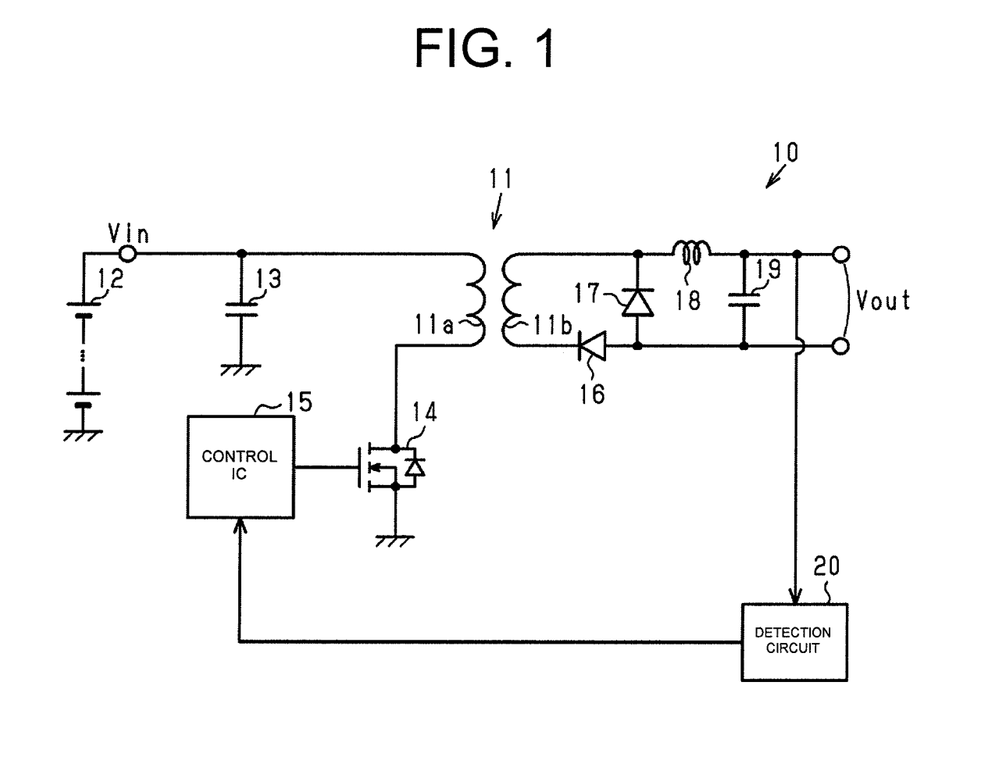
FIG. 1 is a circuit diagram of an insulating DC-DC converter in an embodiment.

As shown in FIG. 1, an insulating DC-DC converter 10 as a power-conversion device is a forward type DC-DC converter and includes a transformer 11. The transformer 11 includes a primary coil (winding) 11a and a secondary coil (winding) 11b. The insulating DC-DC converter 10 is for automobiles and is mounted on a vehicle. The insulating DC-DC converter 10 reduces an input voltage on the primary side of the transformer 11 and outputs to the secondary side of the transformer 11.

One terminal of the primary coil 11a is connected to an input terminal, and the input terminal is connected to a positive terminal of a battery 12. The other terminal of the primary coil 11a is earthed via a primary switching element 14. As the primary switching element 14, a power MOSFET is used.

A positive electrode of a smoothing capacitor 13 is connected between the input terminal and the primary coil 11a of the transformer 11, and a negative electrode of the smoothing capacitor 13 is earthed. An electrolytic capacitor is used for the smoothing capacitor 13. The smoothing capacitor 13 smooths the primary voltage of the transformer 11.

A rectifying circuit including diodes 16, 17 is connected to the secondary coil 11b of the transformer 11. The diode 16 has an anode connected to the ground on the secondary side of the transformer 11 and a cathode connected to one end of the secondary coil 11b of the transformer 11. The diode 17 has an anode connected to the anode of the diode 16 and a cathode connected to the other end of the secondary coil 11b of the transformer 11.

Further, a capacitor 19 is connected in parallel with the diode 17. A coil 18 is provided between the secondary coil 11b of the transformer 11 and the capacitor 19. The coil 18 and the capacitor 19 form a filter circuit.

A control IC 15 is connected to a gate terminal of the primary switching element 14. A pulse signal is outputted from the control IC 15 to the gate terminal of the primary switching element 14, and the primary switching element 14 is switched by such pulse signal. When the primary switching element 14 is in the on state, the energy is supplied from the power source on the primary side to the secondary side. When the primary switching element 14 is in the off state, the energy accumulated in the coil 18 is released to the output. In detail, DC voltage is supplied via the smoothing capacitor 13 to the primary coil 11a of the transformer 11. The control IC 15 controls the on/off of the primary switching element 14. In the on/off of the primary switching element 14, primary current flows to the primary coil 11a during the on period of the primary switching element 14 and secondary current flows by electromotive force at the transformer 11. While the primary switching element 14 is in the off, back electromotive force at the coil 18 causes the current of the coil 18 to flow to the output via the diode 17.

A detection circuit 20 is connected to the control IC 15, and the detection circuit 20 detects the output voltage Vout. The measurement result of the output voltage Vout is sent from the detection circuit 20 to the control IC 15. The control IC 15 uses the measurement result of the output voltage Vout from the detection circuit 20 as a feedback signal to control the duty of the primary switching element 14 so that the output voltage Vout is regulated at a desired constant value.

As the insulating DC-DC converter 10 drives, the transformer 11, the primary switching element 14, and the like generate heat.

Hereinafter, the specific structures of the transformer 11 and the primary switching element 14 will be described. The transformer 11 and the primary switching element 14 are formed by using a multilayer substrate.

The multilayer substrate includes conductive layers (wiring patterns) and insulating layers (resin layers) which are alternately layered.

Figure 2A:
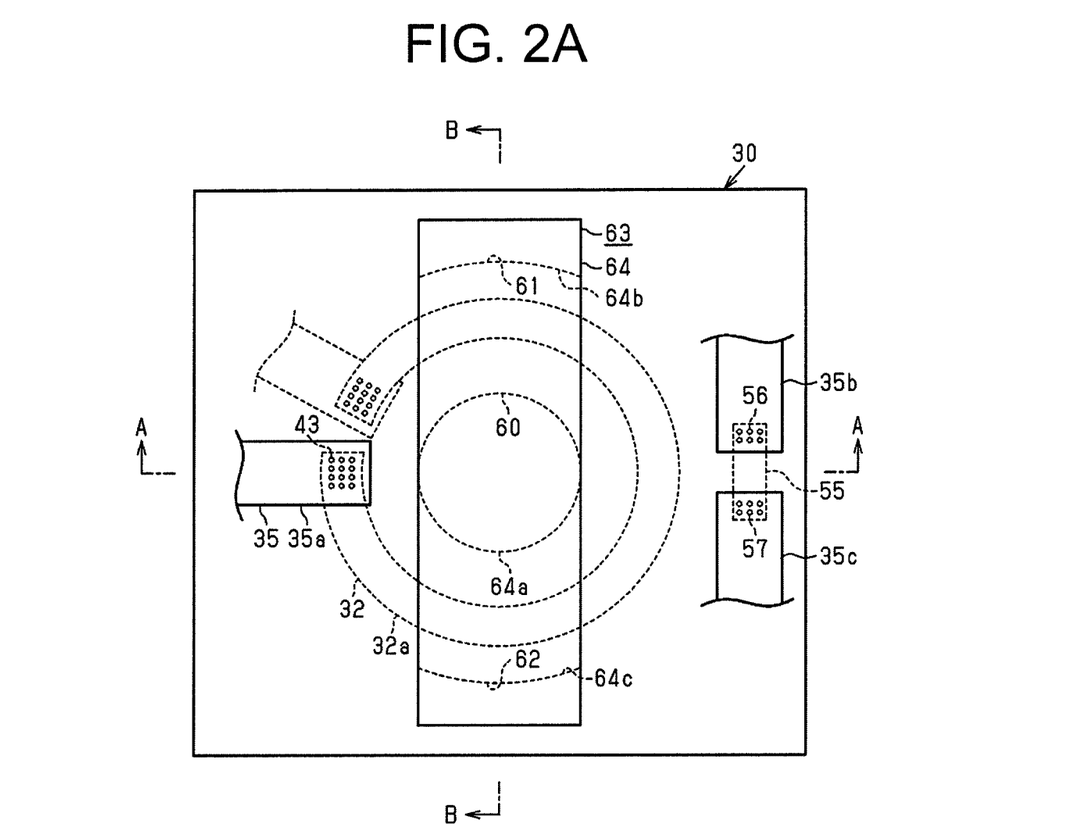
FIG. 2A is a plan view of a multilayer substrate, a magnetic core, and a heat release member.
Figure 2B:
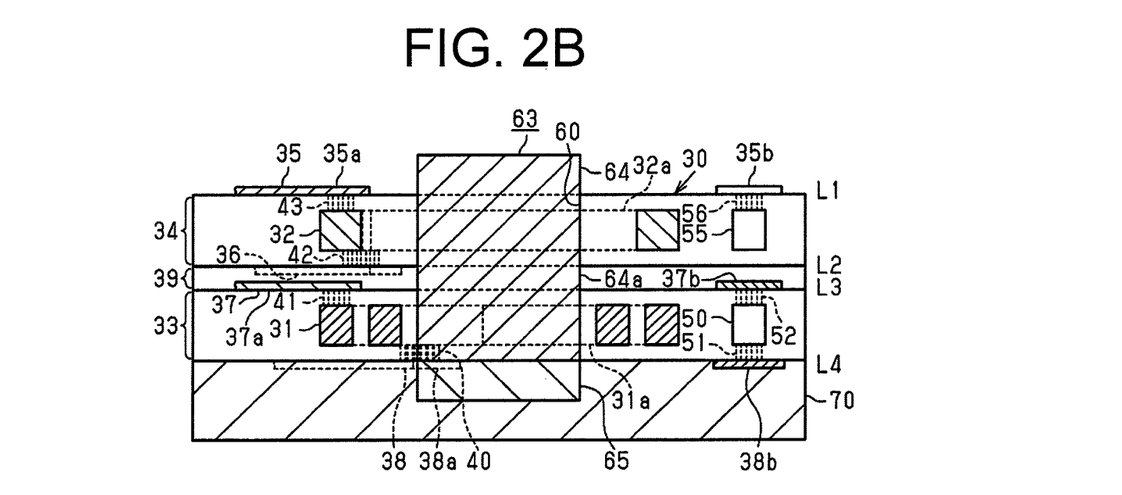
FIG. 2B is a longitudinal sectional view taken along the line A-A in FIG. 2A.
Figure 3:
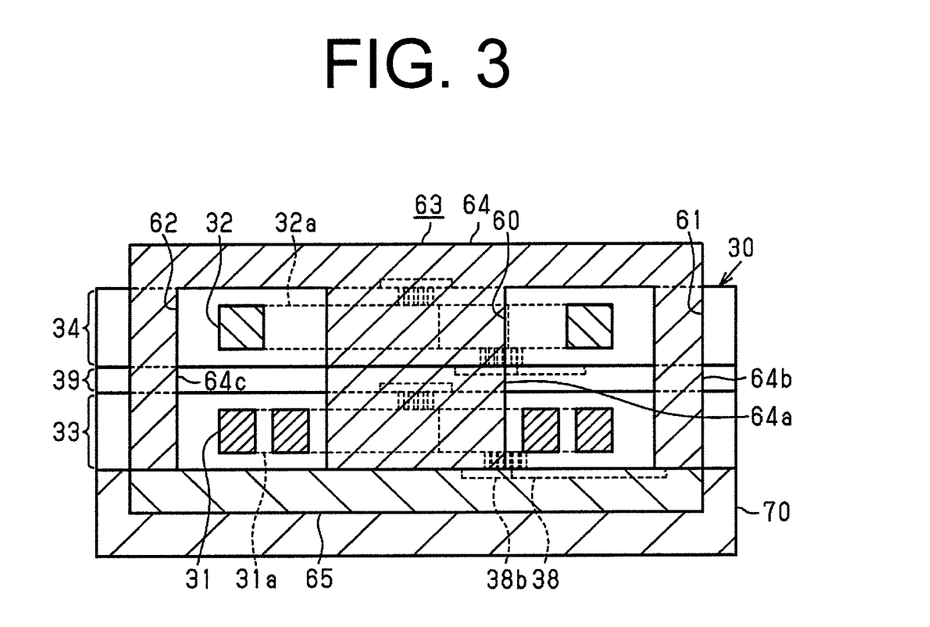
FIG. 3 is a longitudinal sectional view taken along the line B-B in FIG. 2A.

FIG. 2A is a plan view of a multilayer substrate 30, a magnetic core 63, and a heat release member 70, FIG. 2B is a longitudinal sectional view taken along the line A-A of FIG. 2A, and FIG. 3 is a longitudinal sectional view taken along the line B-B of FIG. 2A. As shown in FIGS. 2A and 2B, the multilayer substrate 30 includes a first metal plate 31, a second metal plate 32, a first insulating layer 33, a second insulating layer 34, a first metal foil 35, a second metal foil 36, a third metal foil 37, a fourth metal foil 38, a third insulating layer 39, an electronic component 50, and an electronic component 55. Each of the first metal plate 31 and the second metal plate 32 is a copper plate. Each of the first metal foil 35, the second metal foil 36, the third metal foil 37, and the fourth metal foil 38 is a copper foil. The first metal foil 35 forms a first conductive layer L1, the second metal foil 36 forms a second conductive layer L2, the third metal foil 37 forms a third conductive layer L3, and the fourth metal foil 38 forms a fourth conductive layer L4.

The first metal plate 31 and the second metal plate 32 have a thickness of, for example, about 500 μm. The first metal plate 31 and the second metal plate 32 are patterned by punching, so that a large current can flow therein. The thicknesses of the first metal foil 35, the second metal foil 36, the third metal foil 37, and the fourth metal foil 38 are thinner than the first metal plate 31 and the second metal plate 32 and are, for example, 100 μm or less. The first metal foil 35, the second metal foil 36, the third metal foil 37, and the fourth metal foil 38 are patterned by etching, and patterns are a broad pattern width for a large current flow and a narrow pattern width for a control current flow.

The first metal foil 35 is disposed on an upper surface of the second insulating layer 34, which is one surface of the second insulating layer 34, and the second metal foil 36 is disposed on the lower surface of the second insulating layer 34, which is the other surface of the second insulating layer 34. Similarly, the third metal foil 37 is disposed on an upper surface of the first insulating layer 33, which is one surface of the first insulating layer 33, and the fourth metal foil 38 is disposed on the lower surface of the first insulating layer 33, which is the other surface of the first insulating layer 33.

Figure 4A:
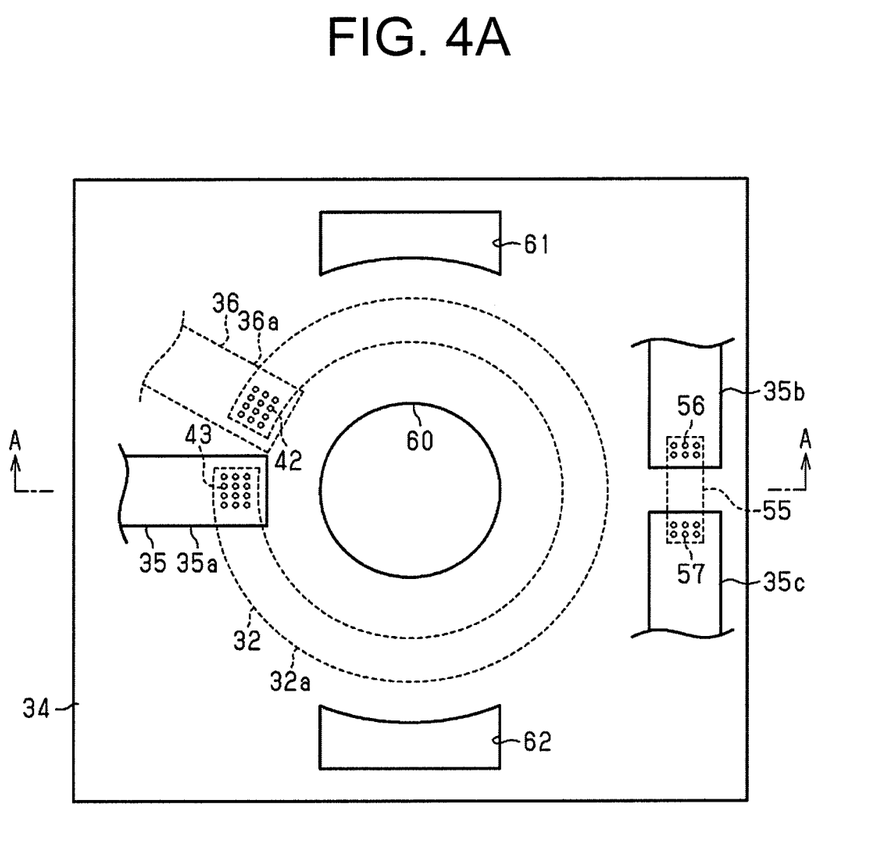
FIG. 4A is a plan view of a disposed portion of a second insulating layer (second metal plate) in the multilayer substrate.
Figure 5A:
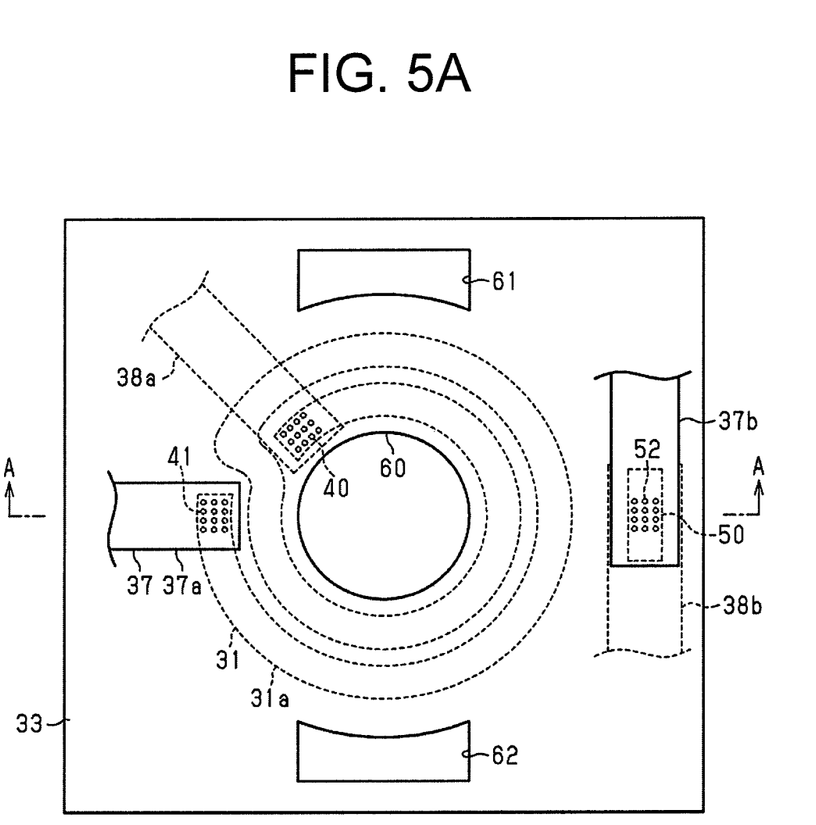
FIG. 5A is a plan view of a disposed portion of a first insulating layer (first metal plate) in the multilayer substrate.

The first metal foil 35 is patterned in a desired wiring shape to form patterns 35a, 35b, and 35c as shown in FIG. 4A. The second metal foil 36 is patterned in a desired wiring shape to form pattern 36a as shown in FIG. 4A. The third metal foil 37 is patterned in a desired wiring shape to form patterns 37a and 37b as shown in FIG. 5A. The fourth metal foil 38 is patterned in a desired wiring shape to form patterns 38a and 38b as shown in FIG. 6.

As shown in FIG. 2B, the second insulating layer 34 is layered on the first insulating layer 33 with the third insulating layer 39 interposed therebetween. That is, the second metal foil 36 is disposed on the third metal foil 37 with the third insulating layer 39 interposed therebetween.

Figure 4B:
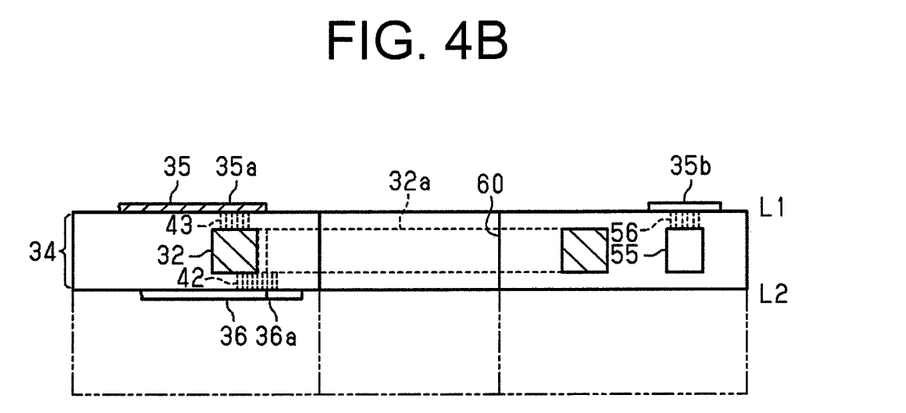
FIG. 4B is a longitudinal sectional view taken along the line A-A in FIG. 4A.
Figure 5B:
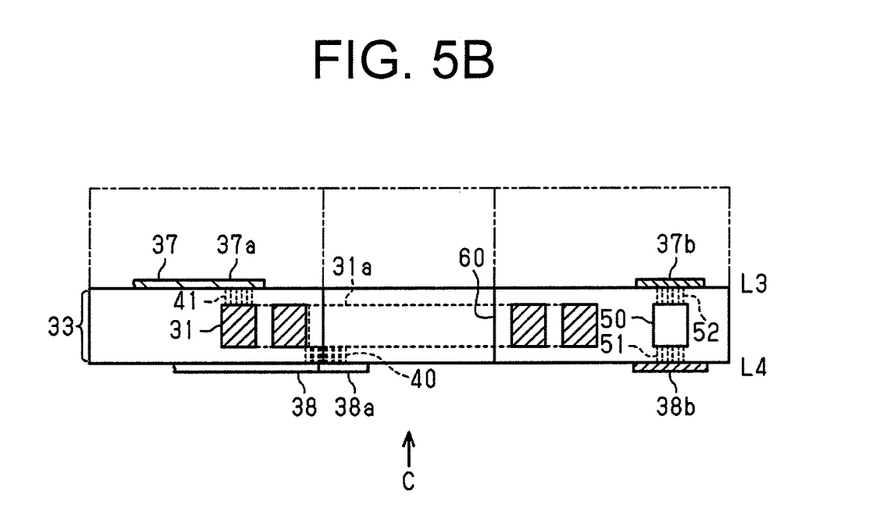
FIG. 5B is a longitudinal sectional view taken along the line A-A in FIG. 5A.

As shown in FIGS. 5A and 5B, the first metal plate 31 is embedded in the first insulating layer 33. As shown in FIGS. 4A and 4B, the second metal plate 32 is embedded in the second insulating layer 34.

Figure 6:
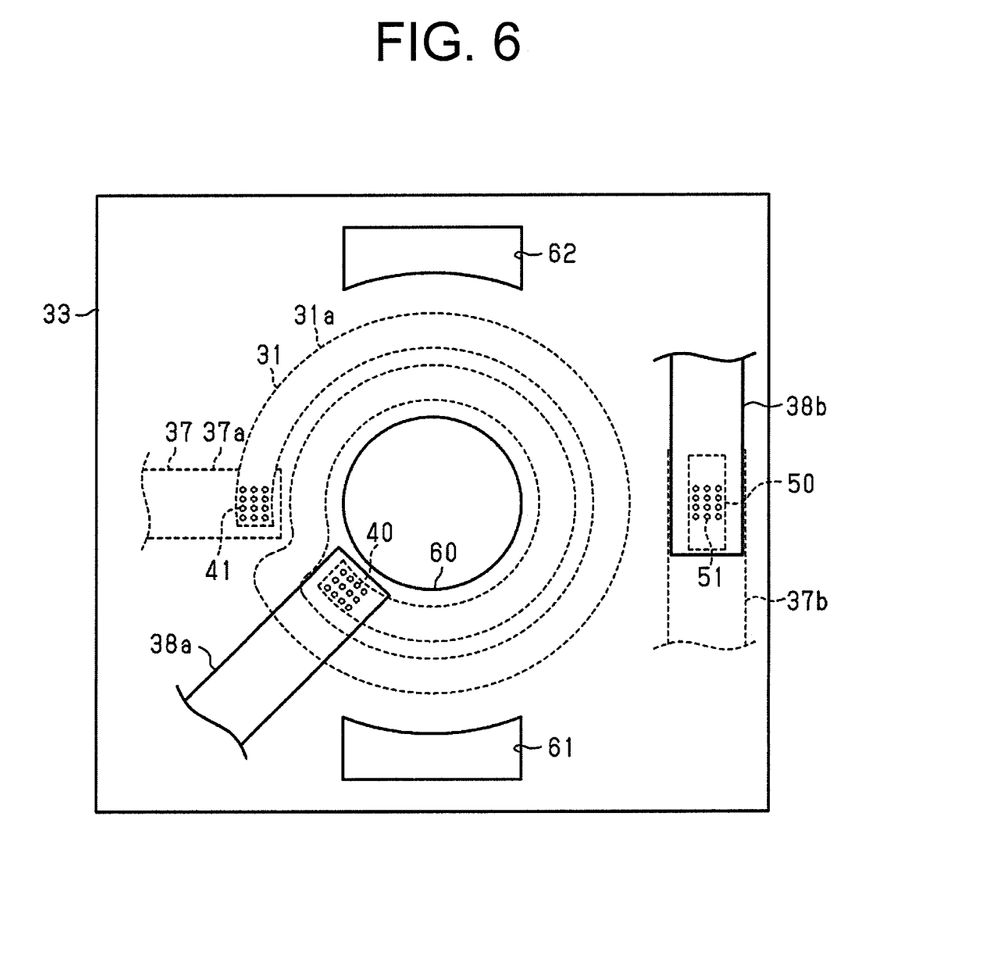
FIG. 6 is a bottom view (an arrow C in FIG. 5B) of a disposed portion of the first insulating layer (first metal plate) in the multilayer substrate.

The first metal plate 31 is patterned in a desired coil shape to form a first coil 31a as a primary coil (winding) as shown in FIGS. 5A and 6. The second metal plate 32 is patterned in a desired coil shape to form a second coil 32a as a secondary coil (winding) as shown in FIG. 4A.

As shown in FIGS. 5A and 5B, the first coil 31a has a spiral shape and the number of turns is "2". As shown in FIGS. 4A and 4B, the second coil 32a has a C-shape and the number of turns is "1". The first coil 31a of the first metal plate 31 and the second coil 32a of the second metal plate 32 are disposed so as to overlap in the vertical direction. In other words, the first coil 31a of the first metal plate 31 and the second coil 32a of the second metal plate 32 face each other in the vertical direction, that is, in a coil-winding axis direction.

Thus, the multilayer substrate 30 includes the first metal plate 31 forming the first coil 31a as the primary coil (winding), the second metal plate 32 facing the first metal plate 31 in the coil-winding axis direction and forming the second coil 32a as the secondary coil (winding), the first insulating layer 33 having therein the first metal plate 31, and the second insulating layer 34 having therein the second metal plate 32.

As shown in FIG. 6, the inner end of the first coil 31a of the first metal plate 31 is connected to the pattern 38a of the fourth metal foil 38 through a plurality of via holes 40, and more specifically, the inner end of the first coil 31a and the pattern 38a are electrically connected to each other through conductors of the plurality of via holes 40. As shown in FIG. 5A, the outer end of the first coil 31a is connected to the pattern 37a of the third metal foil 37 through a plurality of via holes 41, and more specifically, the outer end of the first coil 31a and the pattern 37a are electrically connected to each other through conductors of the plurality of via holes 41.

As shown in FIG. 4A, one end of the second coil 32a of the second metal plate 32 is connected to the pattern 36a of the second metal foil 36 through a plurality of via holes 42, and more specifically, the one end of the second coil 32a and the pattern 36a are electrically connected to each other through conductors of the plurality of via holes 42. As similarly shown in FIG. 4A, the other end of the second coil 32a is connected to the pattern 35a of the first metal foil 35 through a plurality of via holes 43, and more specifically, the other end of the second coil 32a and the pattern 35a are electrically connected to each other through conductors of the plurality of via holes 43.

As shown in FIGS. 5A and 5B, the electronic component 50 is embedded in the first insulating layer 33. The electronic component 50 is, for example, the primary switching element 14 in FIG. 1, that is, a power element (an active component). The electronic component 50 embedded in the first insulating layer 33 may be a power element other than the primary switching element 14, for example, diodes 16, 17 in FIG. 1. The electronic component 50 is connected to the pattern 38b of the fourth metal foil 38 through a plurality of via holes 51, and more specifically, an electrode (e.g., a drain electrode) of the electronic component 50 and the pattern 38b are electrically connected to each other through conductors of the plurality of via holes 51. The electronic component 50 is connected to the pattern 37b of the third metal foil 37 through a plurality of via holes 52, and more specifically, an electrode (e.g., a source electrode) of the electronic component 50 and the pattern 37b are electrically connected to each other through conductors of the plurality of via holes 52. Thus, the electronic component 50 embedded in the first insulating layer 33 is connected to the pattern 38b formed on the fourth metal foil 38.

As shown in FIGS. 4A and 4B, the electronic component 55 is embedded in the second insulating layer 34. The electronic component 55 is, for example, the capacitor 19 in FIG. 1, that is, a passive component. The electronic component 55 is connected to the pattern 35b of the first metal foil 35 through a plurality of via holes 56, and more specifically, an electrode (e.g., a positive electrode) of the electronic component 55 and the pattern 35b are electrically connected to each other through conductors of the plurality of via holes 56. The electronic component 55 is connected to the pattern 35c of the first metal foil 35 through a plurality of via holes 57, and more specifically, an electrode (e.g., a negative electrode) of the electronic component 55 and the pattern 35c are electrically connected to each other through conductors of the plurality of via holes 57.

As shown in FIGS. 2A, 2B, and FIG. 3, core through holes 60, 61, 62 are formed in the multilayer substrate 30. An EI-type magnetic core 63 is assembled in the multilayer substrate 30. The EI-type magnetic core 63 is formed of an E-type magnetic core 64 and an I-type magnetic core 65. In detail, the through hole 60 having a circular shape is formed in the central portion of the coil (the center of the winding) in the multilayer substrate 30. The through holes 61, 62 are formed in the outward side of the coil (the outer peripheral end of the winding pattern) in the multilayer substrate 30. The E-type magnetic core 64 is disposed from one surface of the multilayer substrate 30 so that a central leg portion 64a passes through the through hole 60 and both side leg portions 64b, 64c pass through the through holes 61, 62, respectively. The I-type magnetic core 65 is disposed on the other surface of the multilayer substrate 30 so that the front end face of the central leg portion 64a and the front end faces of both the side leg portions 64b, 64c of the E-type magnetic core 64 abut against the I-type magnetic core 65.

The multilayer substrate 30 assembled with the EI-type magnetic core 63 is disposed on the heat release member (heat sink) 70. The heat release member 70 is planar. The multilayer substrate 30 assembled with the EI-type magnetic core 63 is disposed on the upper surface of the heat release member 70 so as to be thermally joined.

In the multilayer substrate 30, the first insulating layer 33 is disposed closer to the heat release member 70 than the second insulating layer 34 is. In addition, in the multilayer substrate 30, the fourth metal foil 38 is disposed closer to the heat release member 70 than the first metal plate 31 and the second metal plate 32 are.

Next, the action will be described.

As shown in FIGS. 2A, 2B, and FIG. 3, the first metal plate 31 having formed therein the first coil 31a as the primary coil and the second metal plate 32 having formed therein the second coil 32a as the secondary coil are embedded and incorporated in the multilayer substrate 30. Therefore, a space between the first metal plate 31 (first coil 31a) and the second metal plate 32 (second coil 32a) becomes small.

Specifically, the second metal plate 32 (second coil 32a) is disposed between the conductive layers L1 and L2. In addition, the first metal plate 31 (first coil 31a) is disposed between the conductive layers L3 and L4. The first metal plate 31 (first coil 31a) and the second metal plate 32

(second coil 32a) are insulated with the insulating layer 39. Connections are made between the conductive layers L1, L2, L3, and L4 and the metal plates 31, and 32 (coils 31a and 32a), respectively.

In this manner, alternating-current resistance is reduced. Further, great connectivity with a circuit is achieved.

In a configuration in which a magnetic core is mounted to a substrate having a primary coil disposed on one surface of a substrate and a secondary coil disposed on the other surface thereof, a space corresponding to the thickness of the substrate is formed between the primary coil and the secondary coil, which may cause leakage inductance, coil loss, and the height and the size of the magnetic core to increase.

In contrast to this, in the present embodiment, the primary coil and the secondary coil are layered and incorporated in the multilayer substrate, so that the distance between the primary coil and the secondary coil can be decreased, with the result that the transformer loss may be reduced and the downsizing of the transformer may be achieved.

In addition, the multilayer substrate 30 is disposed on the heat release member (heat sink) 70, so that the heat is released from the heat release member 70 when the transformer 11, the primary switching element 14, and the like generate heat with the operation of the insulating DC-DC converter 10.

That is, heat generated in the first coil 31a of the first metal plate 31 is propagated to the heat release member 70 and then released from the heat release member 70 into the atmosphere. Also, heat generated in the second coil 32a of the second metal plate 32 is propagated to the heat release member 70 and then released from the heat release member 70 into the atmosphere. Thus, the distance between the first coil 31a and the second coil 32a may be reduced, which improve the heat release performance and hence the temperature increase of the transformer may be reduced. Similarly, heat generated in the electronic components 50, 55 is propagated to the heat release member 70 and then released from the heat release member 70 into the atmosphere. Here, the electronic component 50 is disposed near the heat release member 70, which results in great heat release performance.

The electronic component 50 is connected to the pattern 38b of the metal foil 38, so that the projected area is reduced with the pattern 38b made finer.

Further, the first metal plate 31 forming the first coil 31a and the electronic component 50 are embedded in the first insulating layer 33. Also, the second metal plate 32 forming the second coil 32a and the electronic component 55 are embedded in the second insulating layer 34. The provision of the metal plate and the electronic component in the same insulating layer prevents the enlargement of the multilayer substrate in the layering direction.

According to the above-mentioned embodiments, the following effect may be obtained:

(1) The multilayer substrate 30 includes the first metal plate 31 forming the first coil, the second metal plate 32 facing the first metal plate 31 in the coil-winding axis direction and forming the second coil, the first insulating layer 33 having therein the first metal plate 31, and the second insulating layer 34 having therein the second metal plate 32, in which the metal foil 38 is connected to the first metal plate 31 through a plurality of via holes 40, and the electronic component 50 embedded in the first insulating layer 33 is connected to the pattern 38b formed on the metal foil 38.

Thus, since the metal foil 38 is patterned to which the electronic component 50 is connected, the pattern can be made finer and a projected area of the multilayer substrate can be reduced, as compared with a case where the first metal plate 31 is patterned to be connected. Further, since the electronic component 50 and the first metal plate 31 are embedded in the first insulating layer 33, the upsizing of the multilayer substrate in the layering direction may be suppressed as compared with a case where the electronic component 50 and the first metal plate 31 are formed in different insulating layers and layered. As a result, the projected area may be reduced and the upsizing in the layering direction may be suppressed.

(2) The first insulating layer 33 is disposed closer to the heat release member 70 than the second insulating layer 34 is, and the metal foil 38 is disposed closer to the heat release member 70 than the first metal plate 31 and the second metal plate 32 are. Although the heat release performance of the electronic component 50 at the metal foil 38 is inferior to the heat release performance of the first metal plate 31, the disposition of the metal foil 38 close to heat release member 70 permits increasing the heat release performance, so that the reduction in the heat release performance may be suppressed.

(3) The electronic component 55, which is a passive component, is embedded in the second insulating layer 34. This allows the passive component (55), which needs low heat release performance, to be formed in the second insulating layer 34.

(4) The electronic component 50 embedded in the first insulating layer 33 is a power element. This provides excellent heat release for the power element, which needs high heat release performance.

Figure 7:
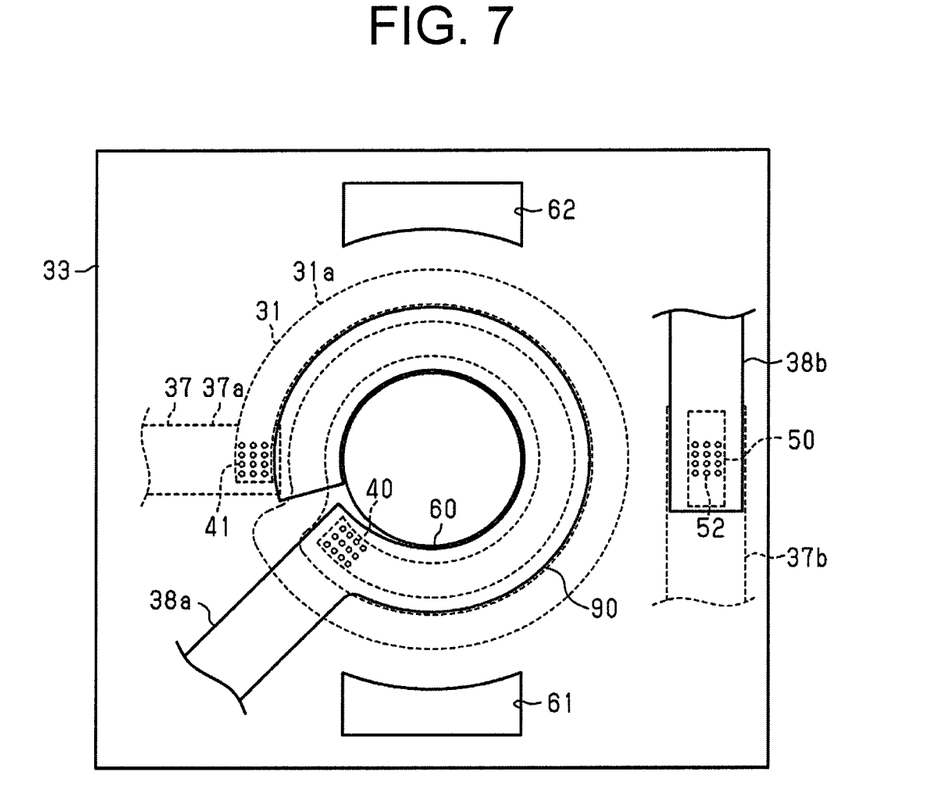
FIG. 7 is a bottom view of another embodiment of the multilayer substrate.

The embodiment is not limited to the above and, for example, may be embodied as follows:

The configuration shown in FIG. 6 may be replaced with the configuration shown in FIG. 7. In FIG. 7, a pattern 90 formed by the fourth metal foil 38 extends along the disposed region of the first coil 31a having the spiral shape from the connected portion (disposed portion of the via holes 40) with the first coil 31a of the first metal plate 31. That is, the pattern 90 extends in a C-shape. Accordingly, heat generated by energizing the first coil 31a can be easily released to the heat release member 70 through the pattern 90 on the extended metal foil. Thus, the heat release performance may be increased.

Figure 8:
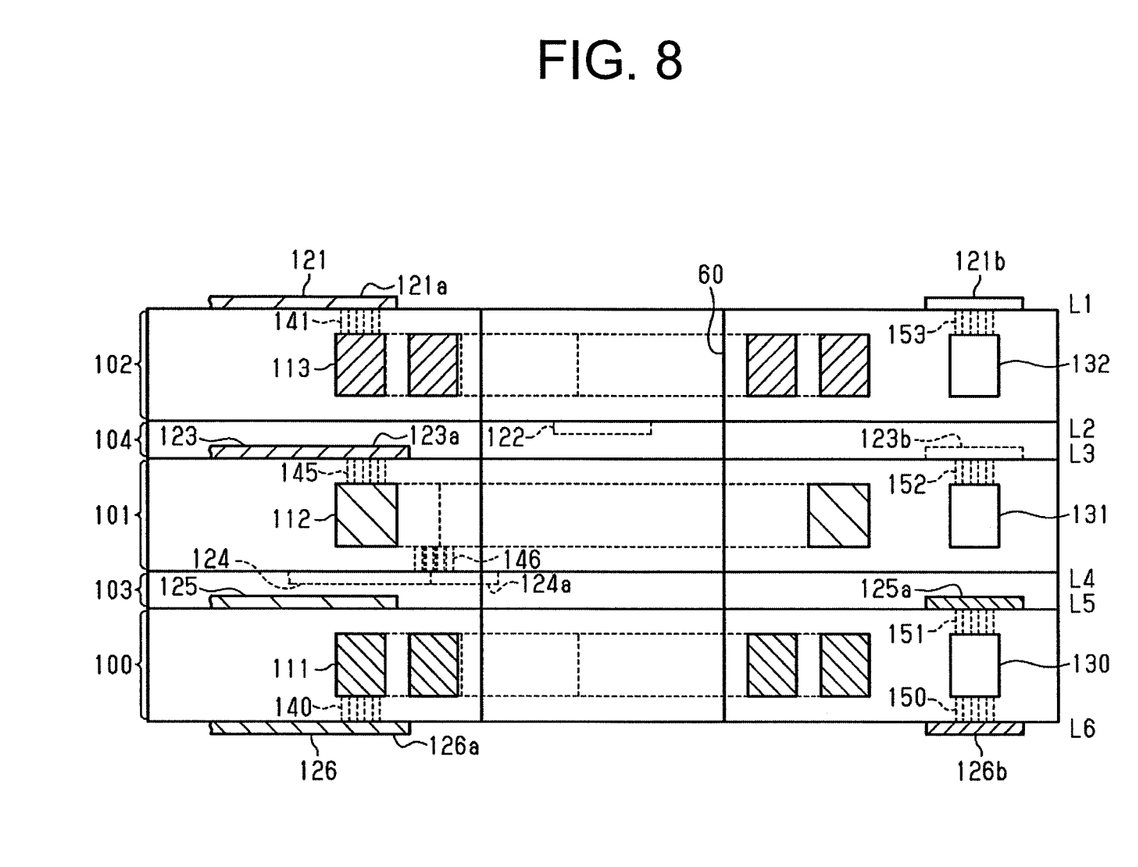
FIG. 8 is a longitudinal sectional view of another embodiment of the multilayer substrate.

The multilayer substrate may include any number of layers as long as it is formed by alternately layered conductive layers (wiring patterns) and insulating layers (resin layers) s. For example, as shown in FIG. 8, a multilayer substrate having conductive layers L1 to L6 of six metal foils 121, 122, 123, 124, 125, 126 may be formed. In FIG. 8, the multilayer substrate includes a first metal plate 111, a second metal plate 112, a third metal plate 113, a first insulating layer 100, a second insulating layer 101, a third insulating layer 102, a first metal foil 121, a second metal foil 122, a third metal foil 123, a fourth metal foil 124, a fifth metal foil 125, a sixth metal foil 126, a fourth insulating layer 103, a fifth insulating layer 104, and electronic components 130, 131, 132. The first metal foil 121 is disposed on the upper surface of the third insulating layer 102, which is one surface of the third insulating layer 102, and the second metal foil 122 is disposed on the lower surface of the third insulating layer 102, which is on the other surface of the third insulating layer 102. The third metal foil 123 is disposed on the upper surface of the second insulating layer 101, which is one surface of the second insulating layer 101, and the fourth metal foil 124 is disposed on the lower surface of the second insulating layer 101, which is the other surface of the second insulating layer 101. The fifth metal foil 125 is disposed on the upper surface of the first insulating layer 100, which is one surface of the first insulating layer 100, and the sixth metal foil 126 is disposed on the lower surface of the first insulating layer 100, which is the other surface of the first insulating layer 100. The second insulating layer 101 is layered on the first insulating layer 100 with the thin fourth insulating layer 103 interposed therebetween. The third insulating layer 102 is layered on the second insulating layer 101 with the thin fifth insulating layer 104 interposed therebetween.

The first metal plate 111 is embedded in the first insulating layer 100. The second metal plate 112 is embedded in the second insulating layer 101. The third metal plate 113 is embedded in the third insulating layer 102.

The first metal plate 111 is patterned in a desired coil shape to form a first coil as a primary coil (winding). The second metal plate 112 is patterned in a desired coil shape to form a second coil as a secondary coil (winding). The third metal plate 113 is patterned in a desired coil shape to form a third coil as a primary coil (winding).

A pattern 126a formed on the metal foil 126 is connected to one end of the primary coil of the first metal plate 111 through a plurality of via holes 140. A pattern 121a formed on the metal foil 121 is connected to one end of the primary coil of the third metal plate 113 through a plurality of via holes 141. The other end of the primary coil of the first metal plate 111 and the other end of the primary coil of the third metal plate 113 are connected to each other through via holes (not shown).

A pattern 123a formed on the metal foil 123 is connected to one end of the secondary coil of the second metal plate 112 through via holes 145. A pattern 124a formed on the metal foil 124 is connected to the other end of the secondary coil of the second metal plate 112 through via holes 146.

Thus, the first metal plate 111 (primary coil), the second metal plate 112 (secondary coil), and the third metal plate 113 (primary coil) form a multiply layered structure.

The electronic component 130 embedded in the first insulating layer 100 is connected to a pattern 126b formed on the metal foil 126 through via holes 150. The electronic component 130 is also connected to a pattern 125a formed on the metal foil 125 through via holes 151. The electronic component 131 embedded in the second insulating layer 101 is connected to a pattern 123b formed on the metal foil 123 through via holes 152. The electronic component 132 embedded in the third insulating layer 102 is connected to a pattern 121b formed on the metal foil 121 through via holes 153.

In FIG. 2B, the first metal plate 31 is connected to the metal foils 37, 38 through via holes, and the second metal plate 32 is connected to the metal foils 35, 36 through via holes, but it is not limited to this configuration. The first metal plate 31 may be connected to any of the metal foils 35, 36, 37, 38 through via holes, and the second metal plate 32 may also be connected to any of the metal foils 35, 36, 37, 38 through via holes.

Similarly, in FIG. 2B, the electronic component 50 is connected to the metal foils 37, 38 through via holes, and the electronic component 55 is connected to the metal foil 35 through via holes, but it is not limited to this configuration. The electronic component 50 may be connected to any of the metal foils 35, 36, 37, 38 through via holes, and electronic component 55 may also be connected to any of the metal foils 35, 36, 37, 38 through via holes.

The transformer is formed by the first coil and the second coil, but is not limited thereto. The transformer may not be formed by the first coil and the second coil.

The magnetic core 63 is a general EI-type magnetic core, but is not limited thereto. The magnetic core may have any shape.

Any kind of the electronic component may be incorporated in the multilayer substrate. The electronic component may be an active component or a passive component, and for example, the control IC 15 that controls the power MOSFET (14) in FIG. 1 may be incorporated.

The metal plates 31, 32 are a copper plate, and the metal foils 35, 36, 37, 38 are a copper foil. However, there is no limitation thereto, and the metal plates 31, 32 may be a metal plate other than the copper plate, and the metal foils 35, 36, 37, 38 may be a metal foil other than the copper foil.

The thicknesses of the metal foil 35, 36, 37, 38 corresponding to the conductive layers of the multilayer substrate may be the same or varied. For example, the conductive layer that allows a large current (power current) to flow may be thick and the conductive layer that allows a small current (control current) to flow may be thin.

The heat release member (heat sink) may be provided on one side or both sides of the multilayer substrate.

The multilayer substrate is embodied in the DC-DC converter, but may be embodied in other power-conversion devices such as an inverter.

REFERENCE SIGNS LIST 30 multilayer substrate
31 first metal plate
32 second metal plate
33 first insulating layer
34 second insulating layer
38 first metal foil
38b pattern
40 via hole
50 electronic component
55 electronic component
70 heat release member

The invention claimed is:

1. A multilayer substrate comprising:
a first metal plate forming a first coil;
a second metal plate facing the first metal plate in a coil-winding axis direction and forming a second coil;
a first insulating layer having therein the first metal plate; and
a second insulating layer having therein the second metal plate,
wherein
a metal foil forming a conductive layer is disposed on at least one of one surface of the first insulating layer, the other surface of the first insulating layer, one surface of the second insulating layer, and the other surface of the second insulating layer,
the conductive layer is connected to the first metal plate through a via hole, and
an electronic component embedded in the first insulating layer is connected to a pattern of the metal foil forming the conductive layer.

2. The multilayer substrate according to claim 1, wherein the first insulating layer is disposed closer to a heat release member than the second insulating layer is, and
the metal foil is disposed closer to the heat release member than the first metal plate and the second metal plate are.

3. The multilayer substrate according to claim 2, wherein the second insulating layer has therein a passive component.

4. The multilayer substrate according to claim 2, wherein the electronic component embedded in the first insulating layer is a power element.

\* \* \* \* \*